United States Patent
Yoon

(10) Patent No.: US 8,422,530 B2
(45) Date of Patent: Apr. 16, 2013

(54) LASER MODULE

(75) Inventor: Ki-Hong Yoon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 178 days.

(21) Appl. No.: 12/961,579

(22) Filed: Dec. 7, 2010

(65) Prior Publication Data

US 2011/0310918 A1 Dec. 22, 2011

(30) Foreign Application Priority Data

Jun. 18, 2010 (KR) .................. 10-2010-0058087

(51) Int. Cl.
*H01S 3/083* (2006.01)

(52) U.S. Cl.
USPC .................................. 372/94; 372/99; 372/26

(58) Field of Classification Search .............. 372/94, 372/99, 26
See application file for complete search history.

(56) References Cited

U.S. PATENT DOCUMENTS

| | | | |
|---|---|---|---|
| 4,896,325 | A | 1/1990 | Coldren |
| 7,622,315 | B2 | 11/2009 | Mason et al. |
| 2007/0002924 | A1* | 1/2007 | Hutchinson et al. ............ 372/98 |
| 2007/0183738 | A1* | 8/2007 | Welch et al. .................. 385/147 |
| 2009/0010592 | A1* | 1/2009 | Yamazaki ..................... 385/14 |
| 2009/0268762 | A1* | 10/2009 | De Merlier et al. ............. 372/20 |

FOREIGN PATENT DOCUMENTS

JP 2008-226985 A 9/2008

OTHER PUBLICATIONS

Ki-Hong Yoon, et al., "2.5Gb/s hybridly-integrated tunable external cavity laser using a superluminescent diode and a polymer Bragg reflector", Optics Express, vol. 18, No. 6, pp. 5556-5561 (2010).
Bin Liu, et al., "Wide Tunable Double Ring Resonator Coupled Lasers", IEEE Photonics Technology Letters, vol. 14, No. 5, pp. 600-602 (2002).
Ki-Hong Yoon, et al., "Monolithically Integrated Tunable Laser Using Double-Ring Resonators With a Tilted Multimode Interference Coupler", IEEE Photonics Technology Letters, vol. 21, No. 13, pp. 851-853 (2009).
Youngchul Chung, et al., "Reflection Properties of Coupled-Ring Reflectors", IEEE Journal of Lightwave Technology, vol. 24, No. 4, pp. 1865-1974 (2006).
R. Paoletti, et al., "15-GHz Modulation Bandwidth, Ultralow-Chirp 1.55-μm Directly Modulated Hybrid Distributed Bragg Reflector (HDBR) Laser Source", IEEE Photonics Technology Letters, vol. 10, No. 12, pp. 1691-1693 (1998).
F.N. Timofeev, et al., "10Gbit/s directly modulated, high temperature-stability external fibre grating laser for dense WDM networks", IEE Electronics Letters, vol. 35, No. 20, pp. 1737-1739 (1999).

* cited by examiner

*Primary Examiner* — Kinam Park
(74) *Attorney, Agent, or Firm* — Rabin & Berdo, P.C.

(57) ABSTRACT

Provided is a laser module. The laser module comprises: a substrate; an gain unit oscillating a laser light on the substrate; an external resonance reflecting unit total-reflecting the laser light at an external of the substrate adjacent to one side of the gain unit; and an inner resonance reflecting unit reflecting the laser light to the external resonance reflecting unit at the substrate between the modulating unit and gain unit and outputting the laser light to the modulating unit.

20 Claims, 5 Drawing Sheets

LASER MODULE

CROSS-REFERENCE TO RELATED APPLICATIONS

This U.S. non-provisional patent application claims priority under 35 U.S.C. §119 of Korean Patent Application No. 10-2010-0058087, filed on Jun. 18, 2010, the entire contents of which are hereby incorporated by reference.

BACKGROUND

The present disclosure relates to a laser module, and more particularly, to a laser module modulating a laser light at high speed.

Recently, as demands on voice, data, and broadcasting convergence services have been increased, a wavelength division multiplexing-passive optical network (WDM-PON), an optical transmission network providing services for high-capacity communication, and development of a light source for the WDM-PON become important. The WDM-PON requires a tunable wavelength laser module, which is used to tune wavelengths of channels having a predetermined wavelength interval, tune wavelengths of each channel finely, and provide a high-speed modulation.

SUMMARY

The present disclosure provides a laser module modulating a laser light at high speed.

The present disclosure also provides a laser module with a wide wavelength tunable range.

The present disclosure also provides a laser module outputting a laser light with a wavelength of a predetermined interval.

Embodiments of the inventive concept provide laser modules comprising: a substrate; an gain unit oscillating a laser light on the substrate; an external resonance reflecting unit total-reflecting the laser light at an external of the substrate adjacent to one side of the gain unit; and an inner resonance reflecting unit reflecting the laser light to the external resonance reflecting unit at the substrate between the modulating unit and gain unit and outputting the laser light to the modulating unit.

In some embodiments, the inner resonance reflecting unit may comprise a comb reflecting unit that selectively reflects the laser light having a wavelength of integer times to the gain unit.

In other embodiments, the comb reflecting unit may comprise at least one of a ring resonator, a bragg grating reflector, and a Fabry-Perot etalon filter.

In still other embodiments, the ring resonator may comprise: a first feedback terminal connected to the gain unit; a first output terminal connected to the modulating unit; a first coupler connecting end terminals of the first output terminal and the first feedback terminal that are respectively opposite to the gain unit and the modulating unit; and a ring resonance waveguide connected to the first coupler and progressing the laser light in a clockwise direction or a counter clockwise direction.

In even other embodiments, the ring resonator may further comprise: a second coupler connected to the other side of the ring resonance waveguide opposite to the first coupler; and a second feedback terminal and a second output terminal splited from the second coupler.

In yet other embodiments, the laser modules may further comprise at least one thin film electrode disposed on at least one of the first feedback terminal, the second feedback terminal, and the ring resonance waveguide and receiving voltage or current from the external to tune a wavelength of the laser light.

In further embodiments, the ring resonator may further comprise a reflecting mirror connected to an end terminal of the second feedback terminal opposite to the second coupler and reflecting a laser light, which is delivered from the ring resonance waveguide to the second feedback terminal, to the ring resonance waveguide again through the second feedback terminal.

In still further embodiments, the ring resonator may further comprise a 3 dB coupler connecting an end terminal of the second feedback terminal opposite to the second coupler with between the gain unit and the first feedback terminal.

In even further embodiments, the laser modules may further comprise a sensor connected to the second output terminal opposite to the second coupler.

In yet further embodiments, the first coupler and the second coupler may comprise at least one of a splitter for splitting a waveguide into two, a gap coupler, or a multi-mode interference coupler.

In yet further embodiments, the first coupler and the second coupler may further comprise a 3 dB coupler having the same power split for the laser light as the first coupler and the second coupler.

In yet further embodiments, the external resonance reflecting unit comprises a film type reflector or a bragg grating reflector.

In yet further embodiments, the laser modules may further comprise a spot size converter on the substrate between the external resonance reflecting unit and the gain unit.

In yet further embodiments, the gain unit may comprise at least one of a gain medium added a super luminescent diode (SLD) and a semiconductor optical amplifier.

In yet further embodiments, the modulating unit may comprise a mach-zehnder interferometric modulator, an electrostatic absorption (EA) type modulator, and a phase modulator.

In yet further embodiments, the laser modules may further comprise an amplifying unit amplifying power of the laser light at a back terminal of the modulating unit.

In yet further embodiments, the laser modules may further comprise a spot size converter at the output port of the amplifying unit on the substrate for high coupling with an optical fiber.

BRIEF DESCRIPTION OF THE DRAWINGS

The accompanying drawings are comprised to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF PREFERRED EMBODIMENTS

Figure 1:
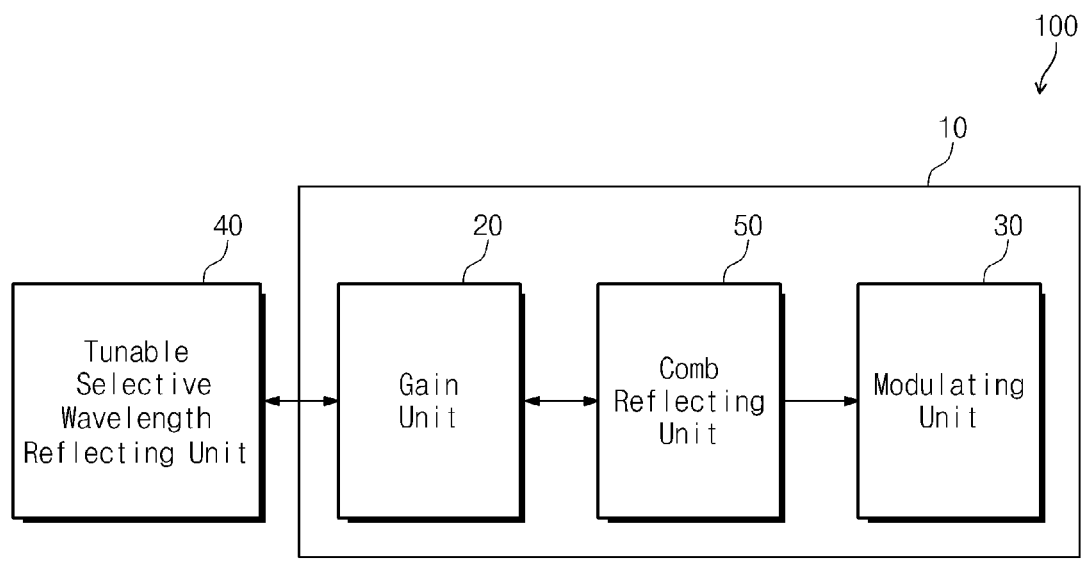
FIG. 1 is a view illustrating a laser module according to an embodiment of the inventive concept.

Hereinafter, exemplary embodiments of the inventive concept will be described below in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like reference numerals refer to like elements.

The meaning of "include," "comprise," "including," or "comprising," specifies a property, a region, a fixed number, a step, a process, an element and/or a component but does not exclude other properties, regions, fixed numbers, steps, processes, elements and/or components. Additionally, since it follows a preferred embodiment, reference numerals suggested in order of description are not limited to their orders.

Figure 2:
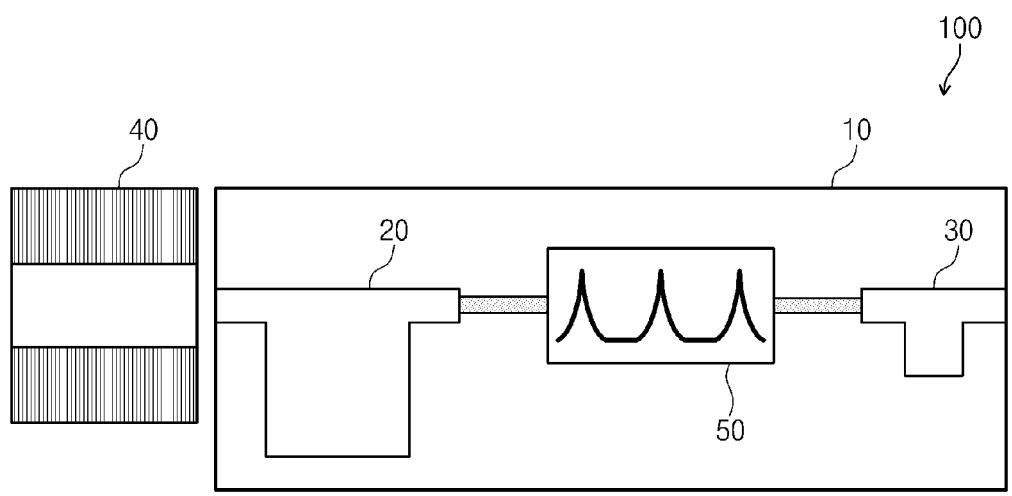
FIG. 2 is a plan view illustrating the detailed laser module of FIG. 1.

FIG. 1 is a view illustrating a laser module according to an embodiment of the inventive concept. FIG. 2 is a plan view illustrating the detailed laser module of FIG. 1.

Referring to FIGS. 1 and 2, the laser module 100 according to the embodiment of the inventive concept may comprise a monolithic integrated comb reflecting unit 50 between an gain unit for oscillating a laser light and a modulating unit for modulating the laser light, on a substrate 10. A tunable selective wavelength reflecting unit 40 may be disposed at the external of one side of the substrate 10 adjacent to the gain unit 20, which faces the comb reflecting unit 50. Although not illustrated in the drawings, in order to increase coupling efficiency between the tunable selective wavelength reflecting unit 40 and the gain unit 20, a spot size converter (SSC) may be integrated to the front end of the gain unit 20, on the substrate 10.

Accordingly, the laser module 100 may modulate a laser light at high speed in the modulating unit 30 on the substrate 10, which is separated from the gain unit 20 by the comb reflecting unit 50. Additionally, the tunable selective wavelength reflecting unit 40 at the external of the substrate 10 may broaden a wavelength tunable range. A laser light may be modulated at a high speed of more than about 10 Gbps.

The tunable selective wavelength reflecting unit 40 and the comb reflecting unit 50 may reflect a laser light at both sides of the gain unit 20. The laser light may be resonated between the tunable selective wavelength reflecting unit 40 and the comb reflecting unit 50. The tunable selective wavelength reflecting unit 40 may comprise an external resonance reflector for reflecting a laser light at the external of the substrate 10. For example, the tunable selective wavelength reflecting unit 40 may comprise a film type reflector or a bragg grating reflector. The tunable selective wavelength reflecting unit 40 may continuously tune a wavelength of the laser light reflected according to a change of a refractive index proportional to a given temperature at the external. The tunable selective wavelength reflecting unit 40 may reflect a laser light in a wide wavelength region. The reflected wavelength of a laser light is continuously tunable due to thermo-optic effects and electro-optic effects depending on a change of current or voltage applied to the tunable selective wavelength reflecting unit 40.

The comb reflecting unit 50 reflects a laser light oscillated from the gain unit 20 and feeds the reflected laser light to the gain unit 20 and the tunable selective wavelength reflecting unit 40. The comb reflecting unit 50 may reflect a laser light having a wavelength that is the integer times of a specific wavelength. The comb reflecting unit 50 may comprise an inner resonance reflecting unit. Additionally, the comb reflecting unit 50 may output a laser light of more than a predetermined uniform intensity, which progresses from the tunable selective wavelength reflecting unit 40 to the gain unit 20, into the modulating unit 30. For example, the comb reflecting unit 50 may comprise at least one of a ring resonator, a bragg grating reflector, and a Fabry-Perot etalon filter.

The gain unit 20 may oscillate a laser light using an electrical signal. For example, the gain unit 20 may comprise a super luminescent diode (SLD), a ridge type semiconductor optical amplifier, and a planar buried hetero structure (PBH) type semiconductor optical amplifier.

The modulator 30 modulates a laser light into a laser light of an electrical digital signal or analog signal. For example, the modulator 30 may comprise a mach-zehnder interferometric modulator, an electro-static absorption (EA) type modulator, and a phase shifter.

The gain unit 20, the modulating unit 30, and the comb reflecting unit 50 may be surrounded by a cladding layer on the substrate 10 or may be exposed to air. As shown in FIG. 2, a first thin film electrode (not shown) and a second thin film electrode (not shown) to which voltage or current is applied may be disposed on the modulating unit 30 and the gain unit 20 on the substrate 10.

Figure 3:
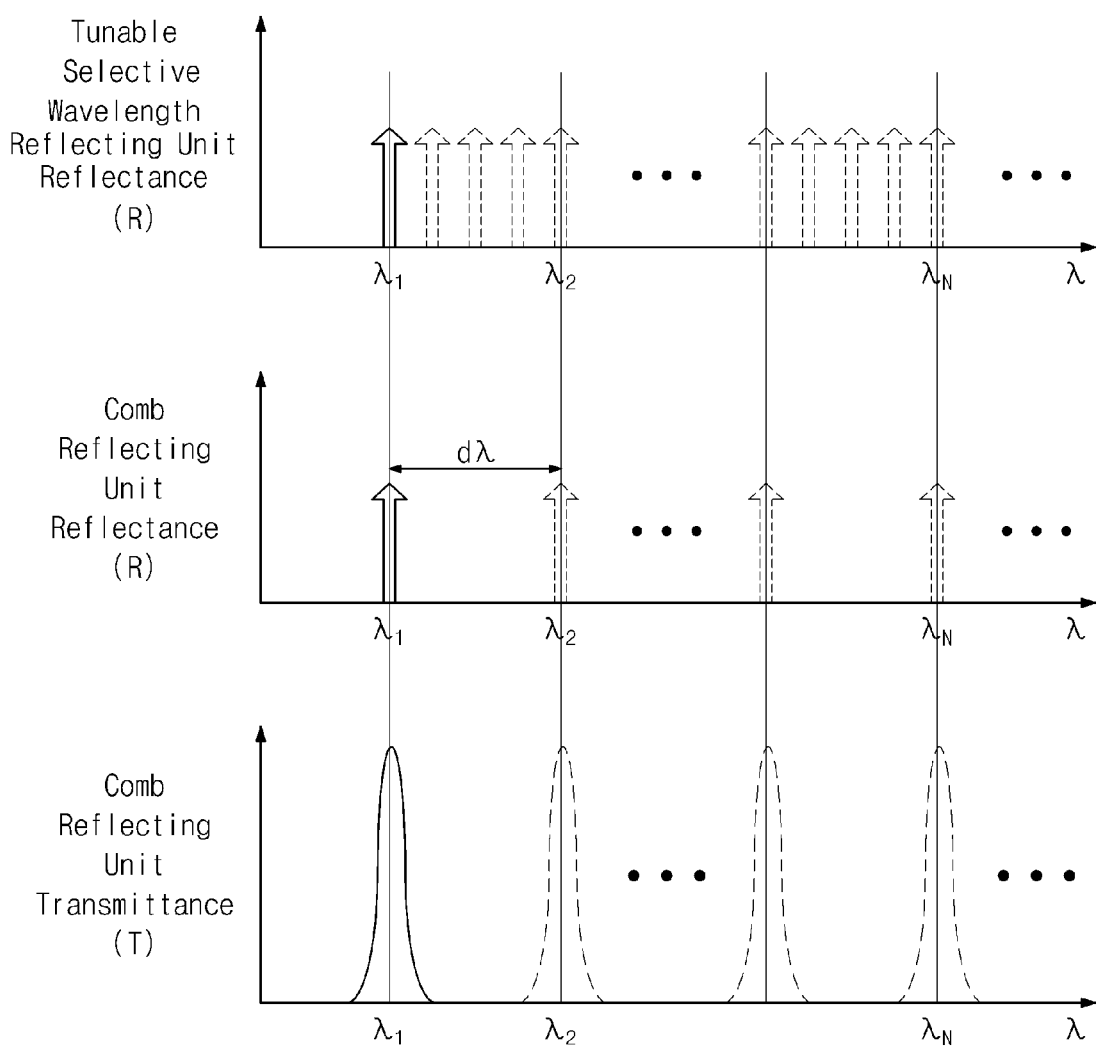
FIG. 3 is graphs compared with reflectance of the tunable selective wavelength reflecting unit, and reflectance and transmittance of the comb reflecting unit according to a wavelength.

FIG. 3 is graphs compared with reflectance of the tunable selective wavelength reflecting unit 40, and reflectance and transmittance of the comb reflecting unit 50 according to a wavelength.

Referring to FIG. 3, the tunable selective wavelength reflecting unit 40 and the comb reflecting unit 50 may reflect and resonate a laser light of the respectively identical reflected wavelengths $\lambda_1, \lambda_2, \ldots \lambda_n$. In addition, the comb reflecting layer 50 may transmit the laser light of the reflected wavelengths $\lambda_1, \lambda_2, \ldots \lambda_n$ from the tunable selective wavelength reflecting unit 40. Here, horizontal axes represent a wavelength band of a laser light and vertical axes represent reflectivity and transmittance of a laser light in a corresponding wavelength band. The tunable selective wavelength reflecting unit 40 may continuously tune a wavelength of a laser light. In addition, the comb reflecting unit 50 may reflect and transmit a laser light having a wavelength of a predetermined wavelength interval $d\lambda$.

For example, when the tunable selective wavelength reflecting unit 40 reflects a laser light of a second wavelength $\lambda_2$, the comb reflecting unit 50 resonates the laser light of the second wavelength $\lambda_2$ and outputs the resonated laser light. Moreover, even if the laser light between the first wavelength and the second wavelength is reflected from the tunable selective wavelength reflecting unit 40, it cannot be outputted through the comb reflecting unit 50. Accordingly, the comb reflecting unit 50 resonates a laser light having a wavelength progressing with a wavelength interval and outputs the resonated laser light. Herein, the comb reflecting unit 50 comprises a ring resonator, a wavelength of a reflected or outputted laser light can be tunable finely.

Figure 4:
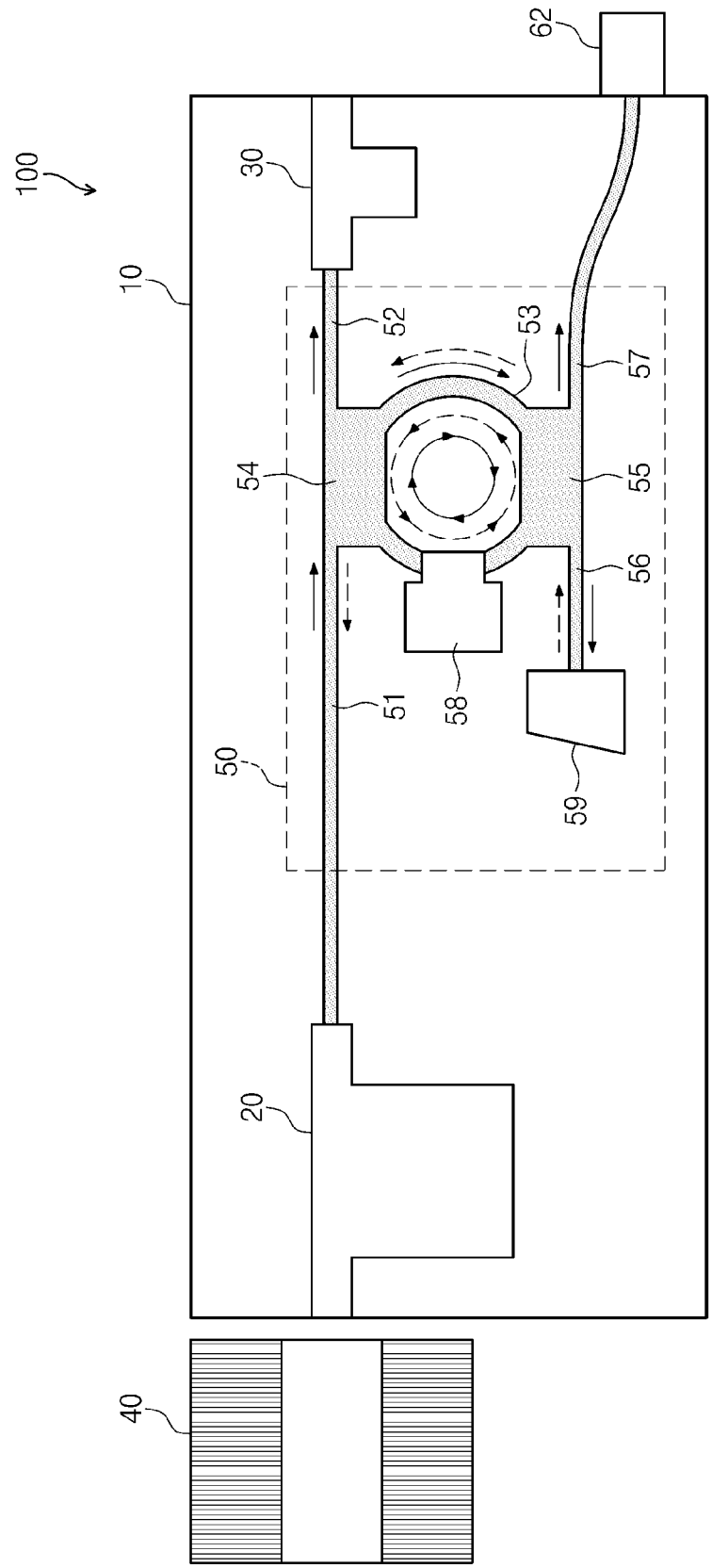
FIGS. 4 and 5 are plan views illustrating the detailed comb reflecting unit of FIG. 2 comprising a ring resonator.
Figure 5:
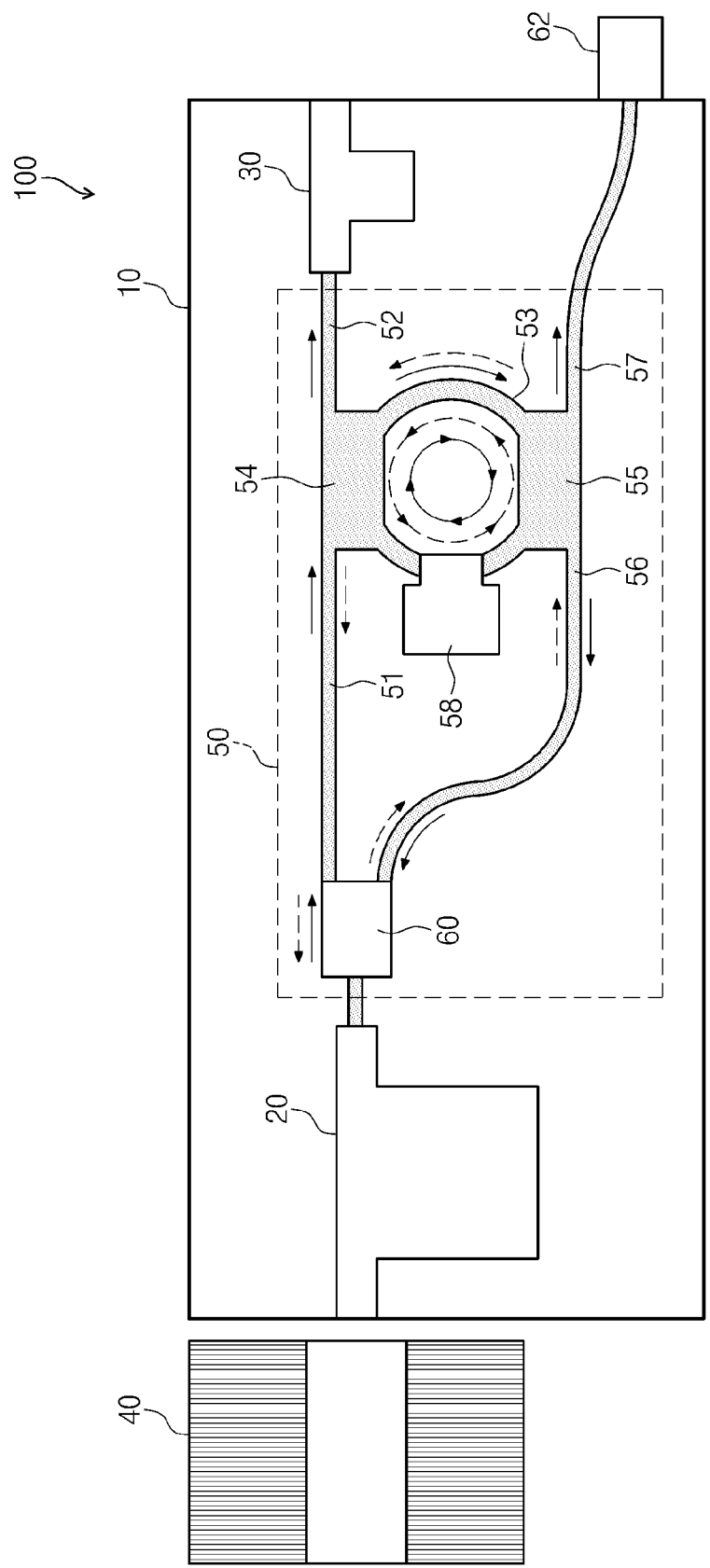

FIGS. 4 and 5 are plan views illustrating the detailed comb reflecting unit 50 of FIG. 2 comprising a ring resonator. The comb reflecting unit 50 may be described with the same reference numeral as a ring resonator.

Referring to FIG. 4, the ring resonator 50 may comprise a ring resonance waveguide 53 connected to a first coupler 54 between a first feedback terminal 51 and a first output terminal 52 and a reflecting mirror 59 connected to a second feedback terminal 56 of a second coupler 55 connected to the ring resonance waveguide 53.

The ring resonance waveguide 53 may resonate a laser light with a wavelength interval corresponding to the length of a ring. The first coupler 54 and the second coupler 55 may deliver some or all of a laser light resonating in the ring resonance waveguide 53 to the first feedback terminal 51 and the first output terminal 52, and the second feedback terminal 56 and a second output terminal 57, respectively. For example, the first coupler 54 and the second coupler 55 may comprise at least one of a gap coupler and a multi-mode interference coupler. In order to improve a laser light output property and laser output power, powers of an optical signal transmitted to the gain unit 20 and the modulating unit 30 may be identical or different. The first coupler 54 and the second coupler 55 may further comprise a 3 db coupler having the same power split for a laser light as those 54 and 55.

The reflecting mirror 59 may reflect a laser light resonating in the ring resonance waveguide 53. A sensor 62 sensing a laser light may be disposed at the second output terminal 57. Although not illustrated in the drawings, a fourth thin film electrode for finely tuning a laser light may be disposed on the second feedback terminal 56 between the ring resonance waveguide 53 and the reflecting mirror 59. The fourth thin film electrode may be disposed on the first feedback terminal 51.

The solid line arrows shown in FIG. 4 represent a laser light being delivered from the tunable selective wavelength reflecting unit 40 and the gain unit 20 to the reflecting mirror 59 and the modulating unit 30 and the dotted line arrows represent a laser light being delivered from the reflecting mirror 59 to the tunable selective wavelength reflecting unit 40 and the gain unit 20. A laser light delivered from the tunable selective wavelength reflecting unit 40 and the gain unit 20 may be reflected at the reflecting mirror 59 through the ring resonance waveguide 53. A laser light may be resonated while progressing in a clockwise direction in the ring resonance waveguide 53. After the laser light reflected from the reflecting mirror 59 may be resonated through the ring resonance waveguide 53, it may be fed back into the tunable selective wavelength reflecting unit 40 and the gain unit 20. A laser light may be resonated while rotating in a counter clockwise direction in the ring resonance waveguide 53. A wavelength interval of a laser light resonating in the ring resonance waveguide 53 may correspond to the following Equation 1.

$$d\lambda = \lambda^2/nL$$ [Equation 1]

where $d\lambda$ is a wavelength interval of a laser light resonated in the ring resonator 50, $\lambda$ is a wavelength of a laser light outputted to the first output terminal 52, n is a reflectivity of the ring resonance waveguide 53, and L is the length of the ring resonance waveguide 53.

A wavelength interval of a laser light resonating in the ring resonance waveguide 53 is proportional to the square of a laser light wavelength outputted from the first output terminal 52, and is inversely proportional to the length of the ring resonance waveguide 53. The ring resonance waveguide 53 may determine a wavelength interval of a laser light. If the length of the ring resonance waveguide 53 is adjusted, a wavelength interval of a laser light outputted to the first output terminal 52 may be easily adjusted.

Accordingly, the laser module 100 according to the embodiment of the inventive concept may output a laser light having a wavelength that is tunable using the integer times of the wavelength interval determined by the length of the ring resonance waveguide 53. A third thin film electrode 58 may be disposed on the ring resonance waveguide 53. Once voltage or current is applied to the third thin film electrode 58, ring resonance conditions are changed by electro-optics such that wavelengths of a laser light reflected from the comb reflecting unit 50 may be tunable finely.

Referring to FIG. 5, the ring resonator 50 may comprise a 3 dB coupler 60 and the ring resonance waveguide 53. The 3 dB coupler 60 may split the first feedback terminal 51 and the second feedback terminal 56 at an optical waveguide connected to the gain unit 20. The ring resonance waveguide 53 may be connected to the first feedback terminal 51 and the second feedback terminal 56 through the first coupler 54 and the second coupler 55, respectively. The first coupler 54 and the second coupler 55 may be connected to the first output terminal 52 and the second output terminal 57 in a direction facing the first feedback terminal 51 and the second feedback terminal 56. The 3 dB coupler 60 may separate a laser light delivered from the tunable selective wavelength reflecting unit 40 and the gain unit 20 into the first feedback terminal 51 and the second feedback terminal 56. For example, the 3 dB coupler 60 may divide a laser light into the first feedback terminal 51 and the second feedback terminal 56, each with 50%, and then may deliver the divided a laser light. Additionally, the 3 dB coupler 60 may feed a laser light returning from the ring resonance waveguide 53 through the first feedback terminal 51 and the second feedback terminal 56 back to the tunable selective wavelength reflecting unit 40 and the gain unit 20.

The solid line arrows and dotted line arrows in FIG. 5 represent a progression direction of a laser light in the comb reflecting unit 50. The solid line arrows and dotted line arrows may represent the same intensity or amount of laser lights having respectively different directions. This is because the 3 dB coupler 60 uniformly distributes a laser light to the first feedback terminal 51 and the second feedback terminal 56. A laser light corresponding to the solid line arrows may rotate in a clockwise direction in the ring resonance waveguide 53 through the first feedback terminal 51 and the first coupler 54. Later, the laser light may be resonated and may be fed back to the gain unit 20 through the second coupler 55 and the second feedback terminal 56. A laser light corresponding to the dotted line arrows may rotate in a counter clockwise direction in the ring resonance waveguide 53 through the second feedback terminal 56 and the second coupler 55. Later, the laser light may be fed back to the gain unit 20 through the first coupler 54 and the first feedback terminal 51 and then may be resonated.

A portion of a laser light progressing through the first feedback terminal 51 and the first coupler 54 may be outputted to the modulating unit 30 through the first output terminal 52. Additionally, a laser light progressing through the second feedback terminal 56 and the second coupler 55 may be outputted to the sensor 62 through the second output terminal.

Figure 6:
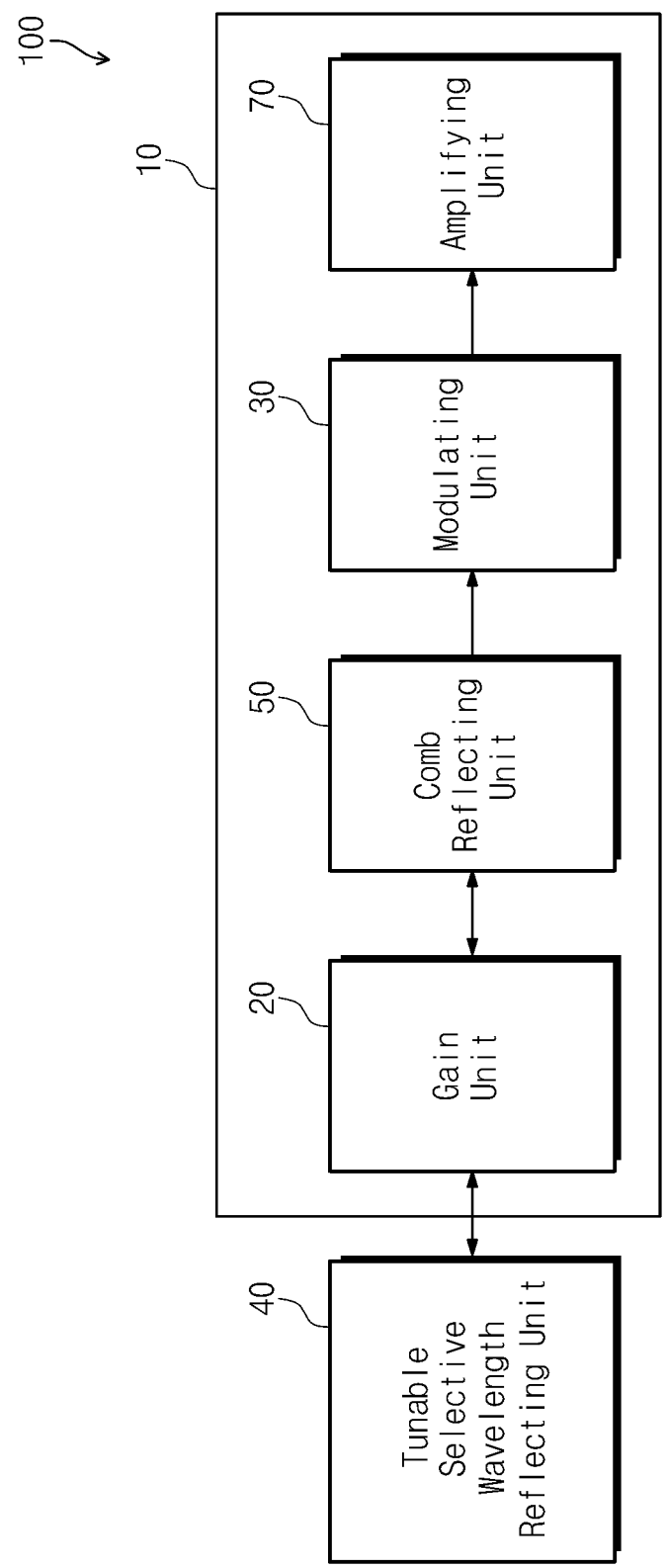
FIG. 6 is a view illustrating a laser module according to the other embodiment of the inventive concept.

FIG. 6 is a view illustrating a laser module according to the other embodiment of the inventive concept.

Referring to FIG. 6, a laser module 100 may comprise an gain unit 20, a comb reflecting unit 50, a modulating unit 30, and an amplifying unit 70, which are monolithic-integrated on a substrate 10. The amplifying unit 70 may amplify output power of a laser light outputted from the modulating unit 30. For example, the amplifying unit may comprise a semiconductor optical amplifier (SOA). A SSC (not shown) connected to the band end of the amplifying unit 70 to increase coupling efficiency with an optical fiber may be integrated on the substrate 10.

Accordingly, the laser module 100 according to the other embodiment of the inventive concept modulates a laser light at high speed in the modulating unit 30 and the amplifying unit 70, which are separated from the gain unit 20 by the comb reflecting unit 50, on the substrate. A laser light is modulated into more than about 10 Gbps and is amplified to more than about 3 dBm.

As mentioned above, according to embodiments of the inventive concept, a comb reflecting unit is disposed between an gain unit and a modulating unit, on a substrate, such that the modulating unit can modulate a laser light at high speed, which is resonated between the gain unit and the comb reflecting unit. Additionally, a tunable selective wavelength reflecting unit disposed at the external of the substrate can broaden a wavelength tunable range and outputs a laser light having a uniform wavelength interval.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A laser module comprising:
   a substrate;
   an gain unit disposed on the substrate and oscillating a first laser light;
   an internal resonance reflecting unit for selectively producing an output laser light and selectively reflecting second laser light to the gain unit, based upon the first laser light, the internal resonance reflecting unit including a comb reflecting unit that includes a ring resonator, the ring resonator including a ring resonance waveguide that receives the first laser light and carries the first laser light in a clockwise direction or a counter-clockwise direction therewithin;
   an external resonance reflecting unit receiving the second laser light from the gain unit and selectively reflecting wavelengths of the second laser light at a position external to the substrate and adjacent to one side of the gain unit; and
   a modulating unit for receiving and modulating the output laser light,
   wherein the internal resonance reflecting unit is disposed at a position on the substrate between the modulating unit and the gain unit.

2. The laser module of claim 1, wherein the comb reflecting unit selectively reflects to the gain unit the second laser light only if the second laser light has a wavelength that is equal to an integer times a predetermined wavelength.

3. The laser module of claim 2, wherein the comb reflecting unit further includes at least one of a Bragg grating reflector, and a Fabry-Perot etalon filter.

4. The laser module of claim 3, wherein the ring resonator further comprises:
   a first feedback terminal connected to the gain unit;
   a first output terminal connected to the modulating unit; and
   a first coupler connecting end terminals of the first output terminal and the first feedback terminal, which are respectively positioned opposite to the gain unit and the modulating unit,
   wherein the ring resonance waveguide is connected to the first coupler.

5. The laser module of claim 4, wherein the ring resonator further comprises:
   a second coupler connected to a side of the ring resonance waveguide that is opposite to a side of the ring resonance waveguide to which the first coupler is connected;
   a second feedback terminal and
   a second output terminal,
   wherein the second feedback terminal and the second output terminal are connected to the second coupler.

6. The laser module of claim 5, further comprising at least one thin film electrode disposed on at least one of the first feedback terminal, the second feedback terminal, and the ring resonance waveguide and receiving voltage or current to tune a wavelength of the first laser light in the internal resonance reflecting unit.

7. The laser module of claim 5, wherein the ring resonator further comprises a reflecting mirror connected to an end terminal of the second feedback terminal opposite to the second coupler and reflecting a laser light, based upon the first laser light, which is delivered from the ring resonance waveguide to the second feedback terminal, and to the ring resonance waveguide again through the second feedback terminal.

8. The laser module of claim 5, wherein the ring resonator further comprises a 3 dB coupler connecting an end terminal of the second feedback terminal opposite to the second coupler with the gain unit and the first feedback terminal.

9. The laser module of claim 5, further comprising a sensor connected to an end of the second output terminal that is opposite to an end of the second output terminal that is connected to the second coupler.

10. The laser module of claim 5, wherein the first coupler and the second coupler comprise at least one of a splitter for splitting a waveguide into two, a gap coupler, and a multimode interference coupler.

11. The laser module of claim 5, wherein the first coupler and the second coupler each comprise a 3 dB coupler having a same power split for laser light as the 3 dB coupler of the other first or second coupler.

12. The laser module of claim 1, wherein the external resonance reflecting unit comprises a film type reflector or a bragg grating reflector.

13. The laser module of claim 1, further comprising a spot size converter on the substrate between the external resonance reflecting unit and the gain unit.

14. The laser module of claim 1, wherein the gain unit comprises at least one of a gain medium, a super luminescent diode (SLD) and a semiconductor optical amplifier.

15. The laser module of claim 1, wherein the modulating unit comprises a mach-zehnder interferometric modulator, an electro-static absorption (EA) type modulator, and a phase modulator.

16. The laser module of claim 1, wherein the modulating unit includes a back terminal transmitting the modulated output laser light, the laser module further comprising an amplifying unit connected to the back terminal and amplifying power of the modulated output laser light.

17. The laser module of claim 16, wherein the amplifying unit includes an output port for outputting the amplified output laser light, further comprising a spot size converter receiving the amplified output laser light from the output port and positioned on the substrate for coupling with an optical fiber.

18. A laser module comprising:
   a substrate;
   a gain unit on the substrate and oscillating a laser light;
   a tunable selective wavelength reflecting unit total-reflecting the laser light at a position external of the substrate and being disposed adjacent to one side of the gain unit and separated from the substrate, the tunable selective wavelength reflecting unit continuously tuning a first wavelength of the laser light;

a comb reflecting unit for resonating second wavelengths of the laser light therein and disposed adjacent to another side of the gain unit on the substrate, the comb reflecting unit selectively reflecting predetermined wavelengths of the laser light to the gain unit and outputting the predetermined wavelengths of the laser light, the comb reflecting unit including a ring resonator, the ring resonator including a ring resonance waveguide that receives the second wavelengths of the laser light and carries the second wavelengths of the laser light in a clockwise direction or a counter-clockwise direction therewithin; and a modulating unit modulating the laser light outputted from the comb reflecting unit and being on the substrate, wherein the comb reflecting unit is between the modulating unit and the gain unit, further wherein the laser module outputs the predetermined wavelengths of the laser light when the first wavelength equals one of the second wavelengths.

19. The laser module of claim 18, wherein the ring resonator further comprises:

a first feedback terminal connected to the gain unit;

a first output terminal connected to the modulating unit; and a first coupler connecting end terminals of the first output terminal and the first feedback terminal, which are respectively positioned opposite to the gain unit and the modulating unit, wherein the ring resonance waveguide is connected to the first coupler.

20. The laser module of claim 19, wherein the ring resonator further comprises:

a second coupler connected to a side of the ring resonance waveguide that is opposite to a side of the ring resonance waveguide to which the first coupler is connected;

a second feedback terminal; and a second output terminal, wherein the second feedback terminal and the second output terminal are connected to the second coupler.

* * * * *